United States Patent [19]

Doktycz et al.

[11] Patent Number: 5,156,725
[45] Date of Patent: Oct. 20, 1992

[54] METHOD FOR PRODUCING METAL CARBIDE OR CARBONITRIDE COATING ON CERAMIC SUBSTRATE

[75] Inventors: Stephen J. Doktycz; Kevin E. Howard, both of Midland, Mich.

[73] Assignee: The Dow Chemical Company, Midland, Mich.

[21] Appl. No.: 778,536

[22] Filed: Oct. 17, 1991

[51] Int. Cl.⁵ .................................. C23C 14/34
[52] U.S. Cl. .................. 204/192.16; 204/192.15; 427/597; 427/331; 427/370
[58] Field of Search ............... 204/192.15, 192.16; 427/35, 331, 356, 357, 369, 370

[56] References Cited

U.S. PATENT DOCUMENTS

| | | | |
|---|---|---|---|
| 3,684,585 | 8/1972 | Stroup | 148/6 |
| 4,094,709 | 6/1978 | Rozmus | 148/126 |
| 4,233,720 | 11/1980 | Rozmus | 29/407 |
| 4,239,819 | 12/1980 | Holzl | 427/255.2 |
| 4,341,557 | 7/1982 | Lizenby | 75/223 |
| 4,461,799 | 7/1984 | Gavrilov et al. | 204/192.16 X |
| 4,483,720 | 3/1987 | Bartlett et al. | 148/6.3 |
| 4,526,748 | 7/1985 | Rozmus | 419/49 |
| 4,547,337 | 10/1985 | Rozmus | 419/49 |
| 4,562,090 | 12/1985 | Dickenson et al. | 427/34 |
| 4,596,694 | 6/1986 | Rozmus | 419/49 |
| 4,597,730 | 7/1986 | Rozmus | 425/78 |
| 4,608,243 | 8/1986 | Sproul | 204/192.16 X |
| 4,654,232 | 3/1987 | Sayano | 427/376.6 |
| 4,656,002 | 4/1987 | Lizenby | 419/10 |
| 4,760,369 | 7/1988 | Tiku | 338/308 |
| 4,783,248 | 11/1988 | Kohlhase | 204/192.17 |
| 4,784,313 | 11/1988 | Godziemba-Maliszewski | 228/194 |
| 4,851,299 | 7/1989 | Godziemba-Maliszewski | 428/606 |
| 4,857,116 | 8/1989 | Allam | 148/279 |
| 4,871,434 | 10/1989 | Munz et al. | 204/192.16 |
| 4,935,073 | 6/1990 | Bartlett et al. | 148/247 |

OTHER PUBLICATIONS

Desu et al., J. Am. Ceram. Soc., 73[3] 509–15 (1990).
Butt et al., J. Am. Ceram. Soc., 73:2690–96 (1990).
Nederveen et al., "The Densification of Plasma Sprayed Coatings by Subsequent Hot Isostatic Pressing."
Joshi et al., Metallurgical Transactions A, 21A:28-29–2837 (1990).
Prichard et al., "Vacuum Plasma Spray of Cb and Ta Metal Matrix Composites", pp. 561–568 (Feb. 1990).

Primary Examiner—Nam Nguyen
Attorney, Agent, or Firm—K. D. Goodman; D. R. Howard

[57] ABSTRACT

A process is disclosed for forming a ceramic coating on a substrate. A metal layer is placed onto the substrate by means such as sputtering. After a carbon-containing foil is applied to the metal-coated substrate, it is subjected to rapid omnidirectional compaction. The resulting product is a densified coated ceramic composition which exhibits improved mechanical properties.

10 Claims, No Drawings 5,156,725

METHOD FOR PRODUCING METAL CARBIDE OR CARBONITRIDE COATING ON CERAMIC SUBSTRATE

BACKGROUND OF THE INVENTION

The present invention relates to processes for forming coatings on ceramic substrates, as well as the products of such processes.

Ceramic materials are finding an ever-increasing number of uses due to their ability to provide desirable mechanical properties while being relatively light weight. One use that has become very important is in machine parts, where a workpiece must undergo repetitive contact with other objects, and thus must be capable of withstanding impact, friction, and/or wear. It is known that the utility of such workpieces, made of metal or ceramics, can be enhanced by providing them with coatings which will increase their superficial resistance to friction, wear, corrosion, impact, or the like.

Among the considerations in selecting or developing a desirable coating are the hardness, strength, and thermal stability of the coating; the chemical reactivity and thermal expansivity of the interface between the substrate and the coating; and the chemical reactivity of the coating's outer surface. These properties are affected by the microstructure of the coating, which depends on the raw materials used as well as the process used to generate the coating.

In achieving the desired mechanical and other properties in a coating, it is often useful to produce a multilayer coating, rather than a single layer of uniform composition. It is also useful to have a mechanism for eliminating or minimizing defects in the microstructure of the coating.

Although various ceramic coatings which have been previously known have some of the above-described desirable characteristics, there is still a need for improved structures which will have even more desirable properties, for the uses outlined above, as well as for other applications.

SUMMARY OF THE INVENTION

The present invention relates to a process for forming a coating on a ceramic substrate. The process comprises the following steps: (1) depositing a metal layer onto a surface of a ceramic substrate, where the metal is selected from the group consisting of tantalum, titanium, zirconium, hafnium, tungsten, molybdenum, chromium, and niobium; (2) placing a material containing at least one of carbon and nitrogen on the substrate; and (3) subjecting the substrate, its deposited layer and the material to rapid omnidirectional compaction, such that a metal carbide or carbonitride layer is formed. Preferred methods of depositing the metal layer include sputtering and electron beam evaporation. Preferred methods of depositing a carbon-containing or nitrogen-containing material are: (a) placing a carbon-containing foil on the metal layer; or (b) sputtering with a target which contains at least one of carbon and nitrogen, whereby a nitride, carbide, or carbonitride is placed on the substrate, subsequently to be densified by the rapid omnidirectional compaction step. The rapid omnidirectional compaction is preferably carried out at an elevated temperature of at least 1200° C. The present invention also relates to a densified coated ceramic composition which is produced by means of the process described above.

The processes and compositions of the present invention have several advantages over prior processes and compositions. The present invention provides good control over the thickness of the coating. It also generates coatings which have a novel microstructure and highly desirable mechanical properties. For example, the coatings of the present invention are believed to be multilayer in nature and contain a gradient structure. The interfaces between the various coating layers are reaction-bonded, which contributes to stronger coating adherence to the substrate and better coating performance over a broad range of operating conditions. The use of rapid omnidirectional compaction removes defects from the coating microstructure. Because such defects can serve as points of origin for failure of the coating, their minimization causes the coating to last longer under high impact and/or wear applications. Further, the removal of defects and the increased density of the coating can provide superior corrosion resistance, by reducing the ability of corrosive materials to permeate into the coating.

It appears that the process of the present invention tends to create oxides in the coating. Without wishing to be bound by any particular theory, it is presently believed that this is due to the reaction of the relatively thin oxophilic coating with oxide sintering additives present in the ceramic substrate, as well as some oxide attack from the glass particles used in the rapid omnidirectional compaction step as a pressure transfer medium.

DETAILED DESCRIPTION OF SPECIFIC EMBODIMENTS

Suitable substrates for the present invention can include a variety of ceramic materials. Specific examples include aluminum nitride, silicon nitride, silicon carbide, titanium carbide, tungsten carbide, and tungsten carbide/6% cobalt. The substrates can take whatever shape is desired, such as a cutting insert for a machine tool.

The first step in the process is to apply a metal layer to the substrate. One suitable means of doing this is magnetron sputtering. Before the metal is deposited, the surface of the substrate is preferably ultrasonically cleaned for approximately 60 minutes in methylene chloride, methanol, and water, followed by oven drying overnight at 100° C. Suitable sputtering apparatus is commercially available and is well known to persons skilled in this field. Suitable sputtering parameters include the following: Ti, Zr, Ta, W, Mo, Cr, Nb, or Hf targets; background pressure $2 \times 10^{-5}$ torr; plasma ignition, 15–30μ; deposition pressure, 10–15μ; DC power: 250–400 watts, 550–700 V; deposition time 15–60 min. The thickness of the metal coating deposited on the substrate by sputtering can range from 0.1 μm to 5 μm, and is preferably between 1–2 μm.

After the metal layer is placed on the substrate, the next step is to wrap the metal coated substrate with a foil which comprises carbon as its majority component, and then subject it to rapid omnidirectional compaction for approximately 5–60 seconds, at a temperature of approximately 1200°–1500° C. Briefly, the rapid omnidirectional compaction (ROC) process involves placing the coated substrate in the cavity of an apparatus, where the remainder of the cavity is then filled with a pressure transfer medium which is substantially incompressible and capable of plastic flow at elevated pressure and temperature. When elevated pressure and temperature are applied to the pressure transfer medium by the apparatus, the medium transfers this pressure uniformly to the coated substrate in all directions. The ultimate result is densification of the coating that has been previously applied to the substrate.

Suitable ROC processes and apparatus are disclosed in one or more of the following U.S. patents, each of which is incorporated here by reference: U.S. Pat. Nos. 4,094,709; 4,233,720; 4,526,748; 4,547,337; 4,596,694; 4,597,730; 4,341,557; 4,656,002; and 4,562,090. Suitable graphite foils can have a thickness of 0.12–0.25 mm (or thicker) and are available, for example, as UCAR Grafoil TM from Union Carbide.

It is preferred to polish the surface of the substrate before sputtering the metal coating on and to remove organic impurities from the surface before wrapping it with the foil.

EXAMPLE 1

A 10 mm×25 mm×2.5 mm bar of silicon nitride, polished with 600 grit diamond on a water wheel, is sputter-coated with titanium for 30 minutes to produce a coating approximately 0.5 $\mu$m thick. The sputtering conditions are: Ar plasma (8.3 $\mu$m pressure), DC power 280 watts, 600 V, Ti target. The resulting Ti-coated silicon nitride bar is then wrapped in graphite foil and compressed by rapid omnidirectional compaction at 1200°–1500° C. for 5–60 seconds. Subsequent annealing is not required.

The preceding description is intended to illustrate specific embodiments of the present invention, not to provide an exhaustive list of all possible embodiments. Persons skilled in this field will recognize that modifications could be made to the disclosed embodiments which would still be within the scope of the invention.

We claim:

1. A process for forming a coating on a ceramic substrate, including the sequential steps of:
    depositing a metal layer onto a surface of a ceramic substrate, where the metal is selected from tantalum, titanium, zirconium, hafnium, and tungsten;
    placing a material containing at least one of carbon and nitrogen on the metal layer; and
    subjecting the substrate, its deposited metal layer and the material to rapid omnidirectional compaction, such that a metal carbide or carbonitride layer is formed.

2. The process of claim 1, where the metal layer is deposited by sputtering.

3. The process of claim 1, where the metal layer is deposited by electron beam evaporation.

4. The process of claim 1, where the ceramic substrate is selected from aluminum nitride, silicon nitride, silicon carbide, tungsten carbide, and mixtures thereof with other metals.

5. The process of claim 1, where the placing of the material containing at least one of carbon or nitrogen on the substrate is accomplished by placing a carbon-containing foil on the substrate.

6. The process of claim 5, where the carbon-containing foil consists essentially of graphite.

7. The process of claim 1, where the placing of the material containing at least one of carbon or nitrogen on the substrate is accomplished by sputtering with a target which contains at least one of carbon and nitrogen.

8. The process of claim 1, where the rapid omnidirectional compaction is conducted at an elevated temperature of at least 1200° C.

9. The process of claim 1, where the metal layer deposited onto the substrate by sputtering is between about 0.1–5 $\mu$m thick prior to rapid omnidirectional compaction.

10. A process for forming a coating on a ceramic substrate, including the steps of:
    depositing a metal layer onto a surface of a ceramic substrate by sputtering, where the metal is selected from tantalum, titanium, zirconium, hafnium, and tungsten, where the metal layer deposited is between about 0.1–5 $\mu$m thick, and where the ceramic substrate is selected from aluminum nitride, silicon nitride, silicon carbide, tungsten carbide, and mixtures thereof with other metals;
    placing a foil which consists essentially of graphite on the metal layer; and
    subjecting the substrate, its deposited metal layer and the foil to rapid omnidirectional compaction at an elevated temperature of at least 1200° C., such that a metal carbide or carbonitride layer is formed.

* * * * *